United States Patent [19]
Goldfarb

[11] Patent Number: 5,914,601
[45] Date of Patent: Jun. 22, 1999

[54] METHOD FOR DETERMINING THE TIME CURVE OF THE BASIC FIELD OF A NUCLEAR MAGNETIC RESONANCE TOMOGRAPHY APPARATUS UNDER SWITCHED GRADIENTS

[75] Inventor: James W. Goldfarb, Poughkeepsic, N.Y.

[73] Assignee: Siemens Aktiengesellschaft, Munich, Germany

[21] Appl. No.: 08/839,901

[22] Filed: Apr. 18, 1997

[30] Foreign Application Priority Data

Apr. 24, 1996 [DE] Germany ............... 196 16 403

[51] Int. Cl.$^6$ ....................................... G01V 3/00
[52] U.S. Cl. ..................... 324/322; 600/414; 600/421
[58] Field of Search ..................... 324/309, 318, 324/307, 322, 310, 311, 300, 306, 320; 600/414, 421

[56] References Cited

U.S. PATENT DOCUMENTS

| | | |
|---|---|---|
| 4,651,096 | 3/1987 | Buonocore . |
| 5,054,489 | 10/1991 | Axel et al. . |
| 5,289,127 | 2/1994 | Doddrell et al. . |
| 5,455,512 | 10/1995 | Groen et al. . |
| 5,617,028 | 4/1997 | Meyer ..................................... 324/320 |

FOREIGN PATENT DOCUMENTS

OS 37 27 055  2/1989  Germany .

OTHER PUBLICATIONS

"Simultaneous Spatial and Spectral Selective Excitation," Meyer et al., Magnetic Resonance in Medicine, vol. 15 (1990) pp. 287–304.

"A Method For Measuring Field–Gradient Modulation Shapes. Application to High–Speed Spectroscopic Imaging," Onodera et al., SMRM Abstracts, 1986 pp. 1398–1399.

*Primary Examiner*—John E. Barlow, Jr.
*Assistant Examiner*—Brij B. Shrivastav
*Attorney, Agent, or Firm*—Hill & Simpson

[57] ABSTRACT

In a method for determining the time curve of the basic field of a nuclear magnetic resonance tomography apparatus under switched gradients, a phase-encoding gradient Gvx is prefixed to a readout gradient Gox. The time position of the signal maximum of a nuclear magnetic resonance signal S under the readout gradient Gox is determined. This is repeated n times with different gradient time surfaces of the phase-encoding gradient. The curve of the phase position over the temporal position of the signal maxima yields the phase error that occurs due to fluctuations of the basic magnetic field.

12 Claims, 5 Drawing Sheets

METHOD FOR DETERMINING THE TIME CURVE OF THE BASIC FIELD OF A NUCLEAR MAGNETIC RESONANCE TOMOGRAPHY APPARATUS UNDER SWITCHED GRADIENTS

BACKGROUND OF THE INVENTION

1. Field of the Invention

The present invention is directed to a method for determining the time curve of the basic field of a nuclear magnetic resonance tomography apparatus under switched gradients.

2. Description of the Prior Art

The chronological stability of the basic magnetic field is of decisive importance in nuclear magnetic resonance tomography. Fluctuations during data acquisition lead to artefacts which in a worst case may result in the total unusability of the image. Superconducting magnet systems exhibit a high field stability a priori. Shielding against external disturbances is thereby also good. Pulse sequences employing switched gradients produce eddy currents that also have $B_0$ field components under certain circumstances, thus altering the basic field. This problem is described, for example, in U.S. Pat. No. 5,289,127. The curve of the $B_0$ field is thereby measured and stored for particular gradient sequences. In a measurement of image data, either the excitation pulses or the received nuclear resonance signals are phase-modulated in such a way that the time dependence of the basic magnetic field is compensated. This patent also mentions the possibility of carrying out a software correction of the received signals instead of this hardware-oriented correction.

The article by H. Bruder et al., "Image Reconstruction for Echo-Planar Imaging with Non-Equidistant k-Space Sampling," Magnetic Resonance in Medicine, 23, pp. 311–323 (1992), explains a possibility for carrying out a phase correction in the direction of the readout gradient in order to remove influences from basic field inhomogeneities.

The article by T. Onodera et al., "A Method for Measuring Field-Gradient Modulation Shapes. Application to High-Speed Spectroscopic Imaging," SMRM Abstracts, 1986, pp. 1398–1399, proposes a method for measuring the curve of a magnetic field gradient. A gradient is prefixed to the gradient to be measured, in the same direction. The point in time of the maximum of a nuclear magnetic resonance signal is acquired and stored. This measurement is repeated with different amplitudes of the prefixed gradient. The envelope of the echo maxima then represents the time integral of the gradient curve.

A similar method for measurement of the time curve of magnetic field gradients is presented in German OS 37 27 055. The k-space trajectory is thereby formed from the position of the maxima. The chronological gradient curve is obtained by time differentiation of the k-space trajectory.

SUMMARY OF THE INVENTION

An object of the present invention is to provide a method for determining the time curve of the basic field of a nuclear magnetic resonance apparatus using switched gradients in such a way that special measurement probes are not required.

The above object is achieved in accordance with the principles of the present invention in a method for determining the time curve of the basic field of a nuclear magnetic resonance apparatus in the presence of switched gradients, wherein a nuclear magnetic resonance signal is excited and phase-encoding gradient in at least one phase-encoding gradient is activated. A readout gradient in the same direction as the phase-encoding direction, but with inverted or alternating polarity, is activated. The resulting nuclear magnetic resonance signal is read out under the readout gradient. The chronological position of at least one signal maximum of the nuclear magnetic resonance signal is stored, and the above steps are repeated n times with different gradient time surfaces of the phase-encoding gradient. The curve of the phase position of the stored signal maxima over time is determined and is employed as a measure of the magnetic field deviation prevailing at the time of each signal maximum.

Phase-encoding and readout can take place in one, two or three directions, with the second and third directions being each perpendicular to the first direction.

The time curve of the phase position of the stored signal maxima can be stored and used for phase correction of measured nuclear magnetic resonance signals in subsequent image measurements with the same readout gradients. This can be accomplished, for example, by using the stored time curve to control the frequency of a demodulator applied during reception of a nuclear magnetic resonance signal, or the time curve can be stored in a manner associated with the readout gradients which produce the time curve, and can then be used for phase correction of the radio frequency excitation pulses in image measurements wherein the same gradients are used.

DESCRIPTION OF THE PREFERRED EMBODIMENTS

If relaxation effects are neglected, then, under the influence of a single magnetic field gradient Gx(t) and a time-dependent field inhomogeneity $\Delta B_0(x, y, z, t)$, the following curve of the MR signal s(t) is obtained:

$$s(t) = \int_{\{x,y,z\}} \rho(x, y, z) e^{i2\pi\gamma(x \int_0^t Gx(T) dT)} e^{i2\pi\gamma \int_0^t \Delta B_0(x,y,z,T) dT} dx\, dy\, dz \quad (1)$$

wherein $\rho(x, y, z)$ is the nuclear spin density at the location x, y, z. In the following, a pulse sequence according to FIGS. 1 to 4 is considered in more detail.

Figure 1:
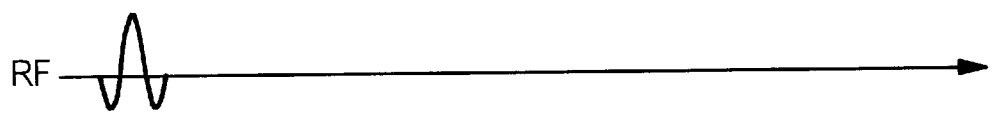
FIGS. 1–4 illustrate a pulse sequence for operating a magnetic resonance imaging apparatus in accordance with the principles of the present invention.
Figure 2:

A frequency-selective radio-frequency pulse RF is emitted into an examination subject as shown in FIG. 1, which pulse operates in slice-selective fashion under the effect of a slice selection gradient Gz according to FIG. 2. There subsequently follows a negative partial pulse Gz of the slice selection gradient Gz, so that the dephasing effected by the positive partial pulse is again canceled. A sequence of a gradient Gx is subsequently switched in the readout direction. This consists of a phase-encoding gradient in the form of a prefixed variable part Gvx and a readout gradient in the form of an oscillating part Gox. Under the oscillating gradient part Gox, the pending nuclear magnetic resonance signal is read out in a measurement window designated AQ in FIG. 4.

As is generally known, each resonance signal exhibits a maximum when it is completely rephased. The following must thus hold under the effect of a gradient Gx:

$$\int_0^T Gx(T) dT = 0 \quad (2)$$

Applied to the pulse sequence according to FIGS. 1 to 4, this means that the following condition must be fulfilled:

$$\int Gvx \, dT = -\int Gox \, dt \quad (3)$$

If this condition is fulfilled, a term drops out of equation 1, so that the following complex signal s(t) is obtained at the time of the signal maxima:

$$s(t) = \int_{\{x,y,z\}} \rho(x, y, z) dx\, dy\, dz \, e^{i2\pi\gamma \int_0^T \Delta B_0(x,y,z,T) dT} \quad (4)$$

The phase along the signal maxima thus comes to (under the assumption that $\rho(x, y, z)$ is real):

$$\arg(S(t)) = 2\pi\gamma \int_0^T \Delta B_0(x, y, z, T) dT \quad (5)$$

Figure 5:
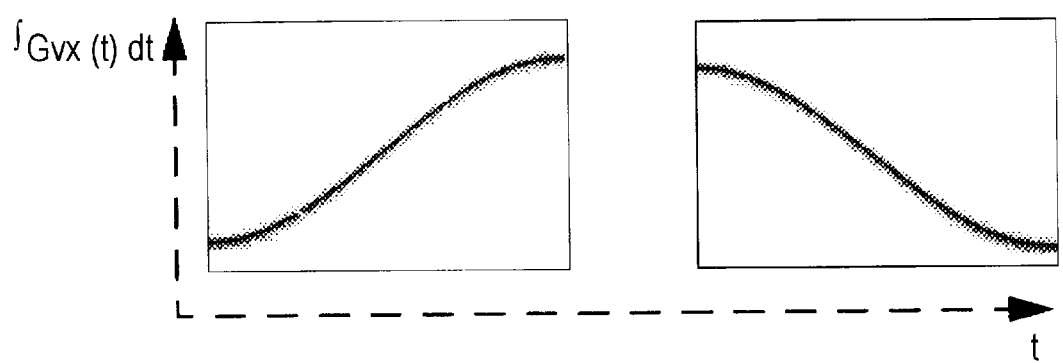
FIG. 5 shows the chronological position of the signal maxima dependent on the integral over the gradient Gvx, in the pulse sequence of FIGS. 1–4.

FIG. 5 illustrates the chronological position of the signal maxima dependent on the integral over the gradient Gvx. The phase of the signal maxima along this curve is thus proportional to the integral over the basic field inhomogeneity.

Figure 6:
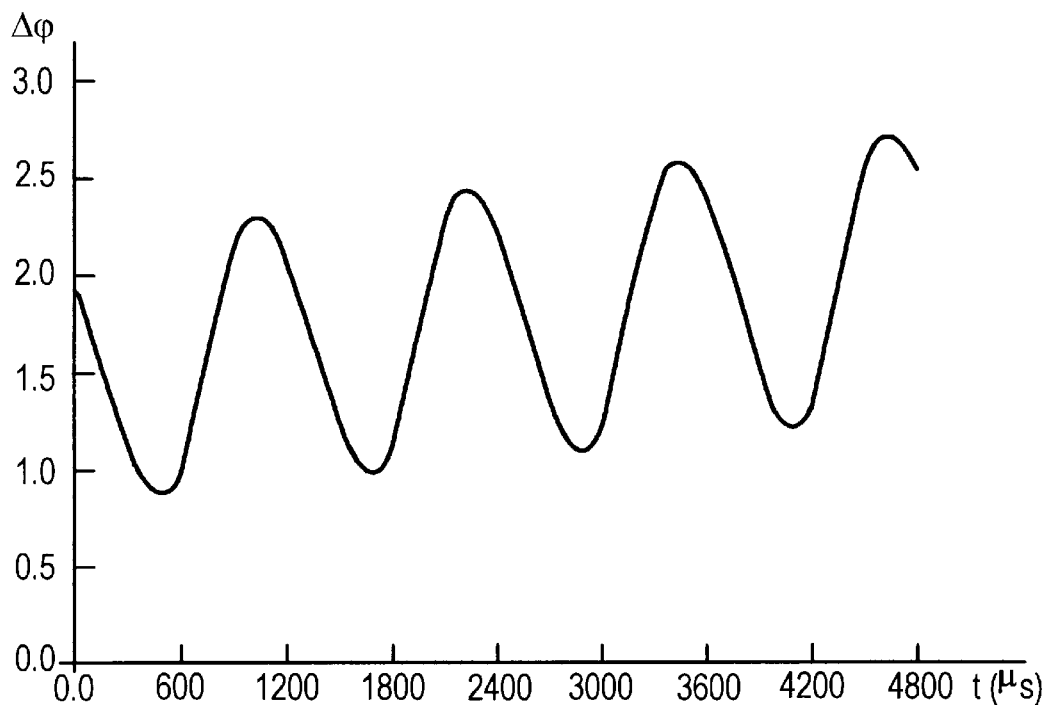
FIG. 6 shows a measured phase curve of the signal maxima over four periods of a purely sinusoidal readout gradient Gox, in the pulse sequence of FIGS. 1–4.
Figure 7:
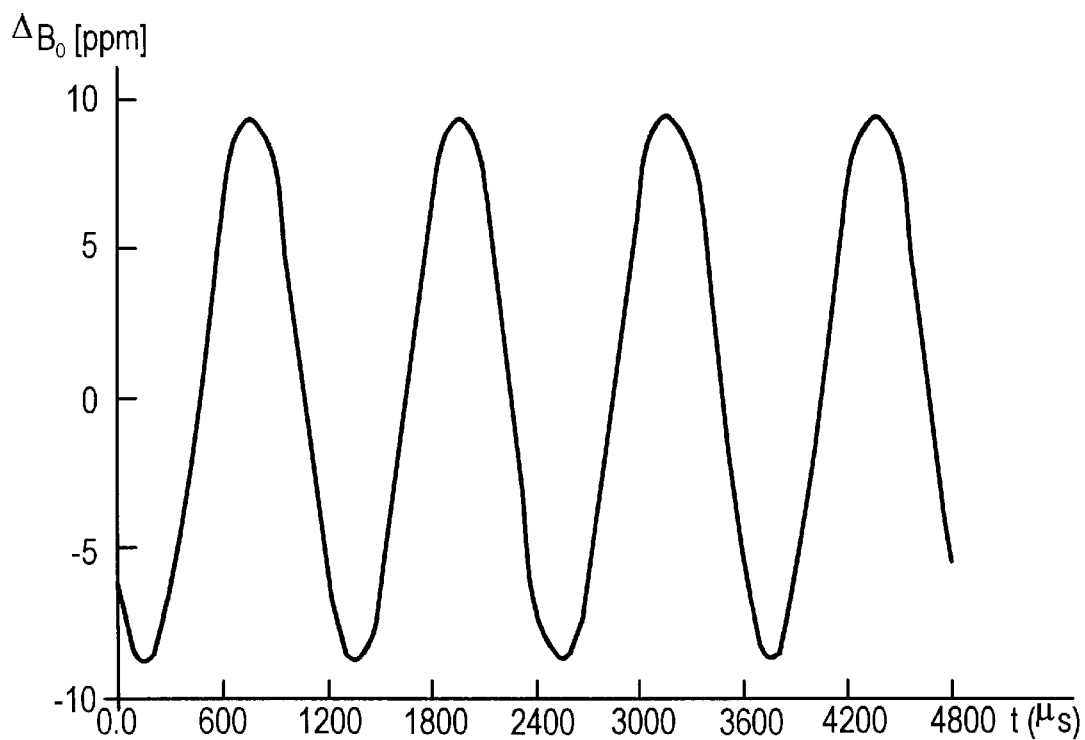
FIG. 7 shows the deviation $\Delta B_0(t)$ determined from the phase curve of FIG. 6.
Figure 8:
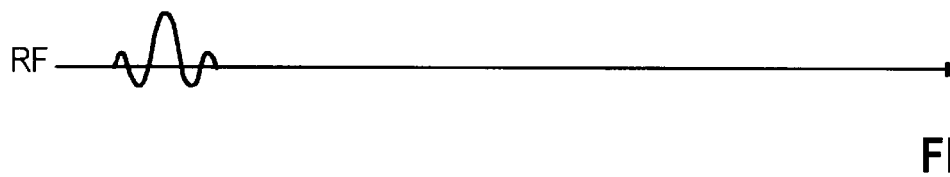
FIGS. 8–13 illustrate an echo planar imaging pulse sequence with which the inventive method is employed.
Figure 9:
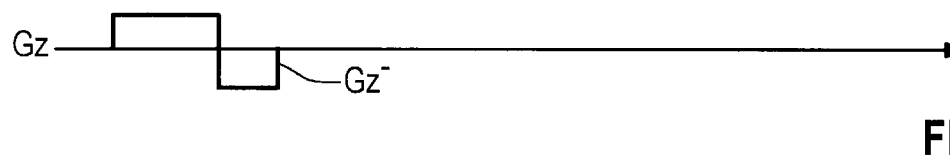
Figure 10:
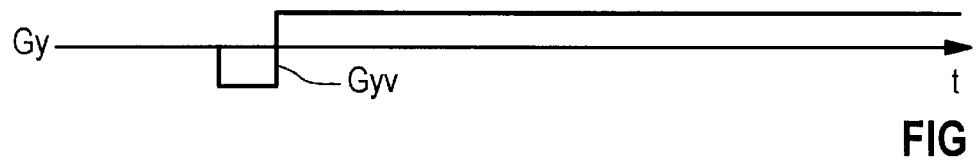
Figure 11:
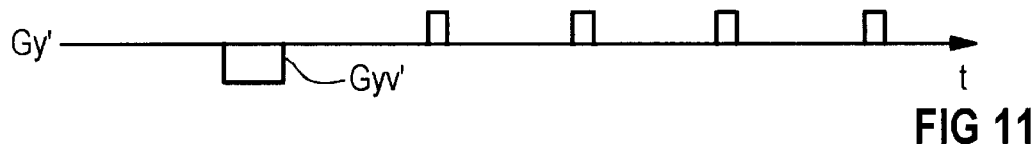
Figure 12:
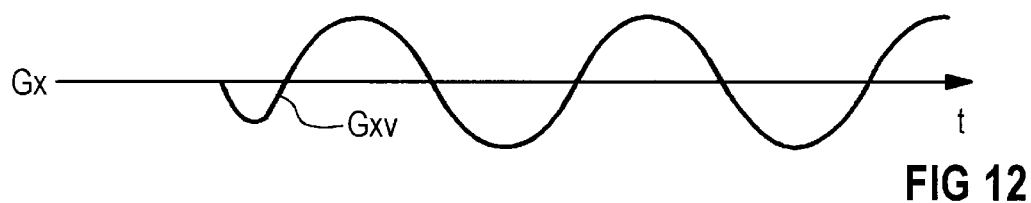
Figure 13:
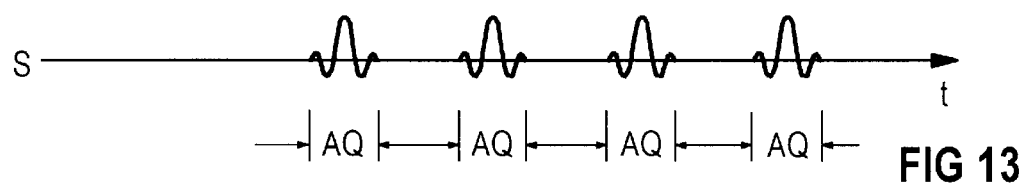

FIG. 6 shows an actually measured phase curve of the signal maxima over four periods of a purely sinusoidal readout gradient Gox. FIG. 7 shows the deviation $\Delta B_0(t)$, determined from this phase curve, of the basic magnetic field.

Figure 3:
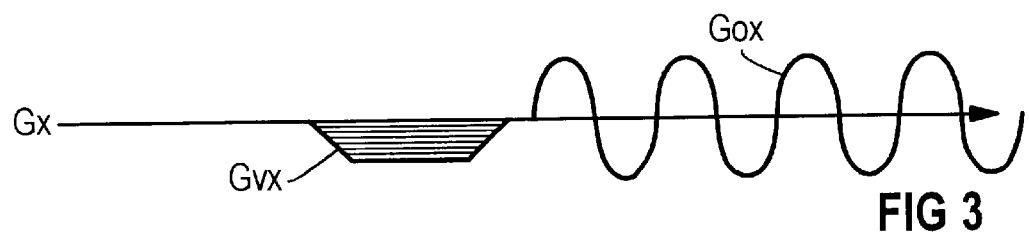
Figure 4:
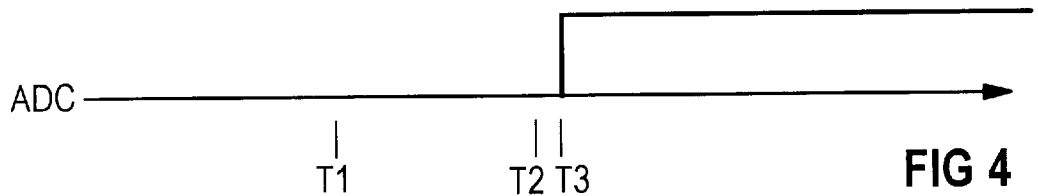

The information thereby obtained concerning the phase response of the signal maxima, or the magnetic field inhomogeneity determined therefrom is specific to the applied readout gradient Gox and the disturbance of the basic magnetic field caused by it. During the acquisition of image data, this information can now be used to correct, with respect to phase errors, nuclear magnetic resonance signals that were obtained under just these gradients. A sinusoidal gradient corresponding to the exemplary embodiment in FIG. 3 is used, for example, in the EPI (echoplanar imaging) method, as shown in FIGS. 8 to 13. In order to obtain image data according to FIG. 8, a slice of the subject under examination is first excited under a frequency-selective radio-frequency pulse RF, with the simultaneous effect of a slice selection gradient Gz. Subsequently, a negative slice selection gradient pulse Gz, for the rephasing of the dephasing caused by the positive part of the slice selection gradient $G_z$, is activated, as is a pre-phasing gradient Gyv, in the phase-encoding direction according to FIGS. 10 or 11. In addition, a pre-phasing gradient Gxv is activated in the readout direction. Finally, according to FIG. 12 a readout gradient Gx with alternating sign is switched, causing a nuclear magnetic resonance signal S according to FIG. 13 to arise under each sub-pulse through rephasing. In addition, the nuclear magnetic resonance signals must be phase-encoded in the y direction. This can ensue by means of a continuously activated phase-encoding gradient Gy according to FIG. 10, which effects a continuous increase of the phase-encoding. Alternatively, a "blip" of a phase-encoding gradient Gy according to FIG. 11 can be switched between two nuclear magnetic resonance signals S, which further switches the phase-encoding step-by-step. The nuclear magnetic resonance signals are acquired in measurement windows AQ, demodulated in phase-sensitive fashion, digitized and entered into a raw data matrix according to real and imaginary parts. An image is acquired from this raw data matrix by means of two-dimensional Fourier transformation. More detailed information about this method can be found in the article already cited in "Magnetic Resonance in Medicine," 23, pp. 311–323 (1992).

Figure 14:
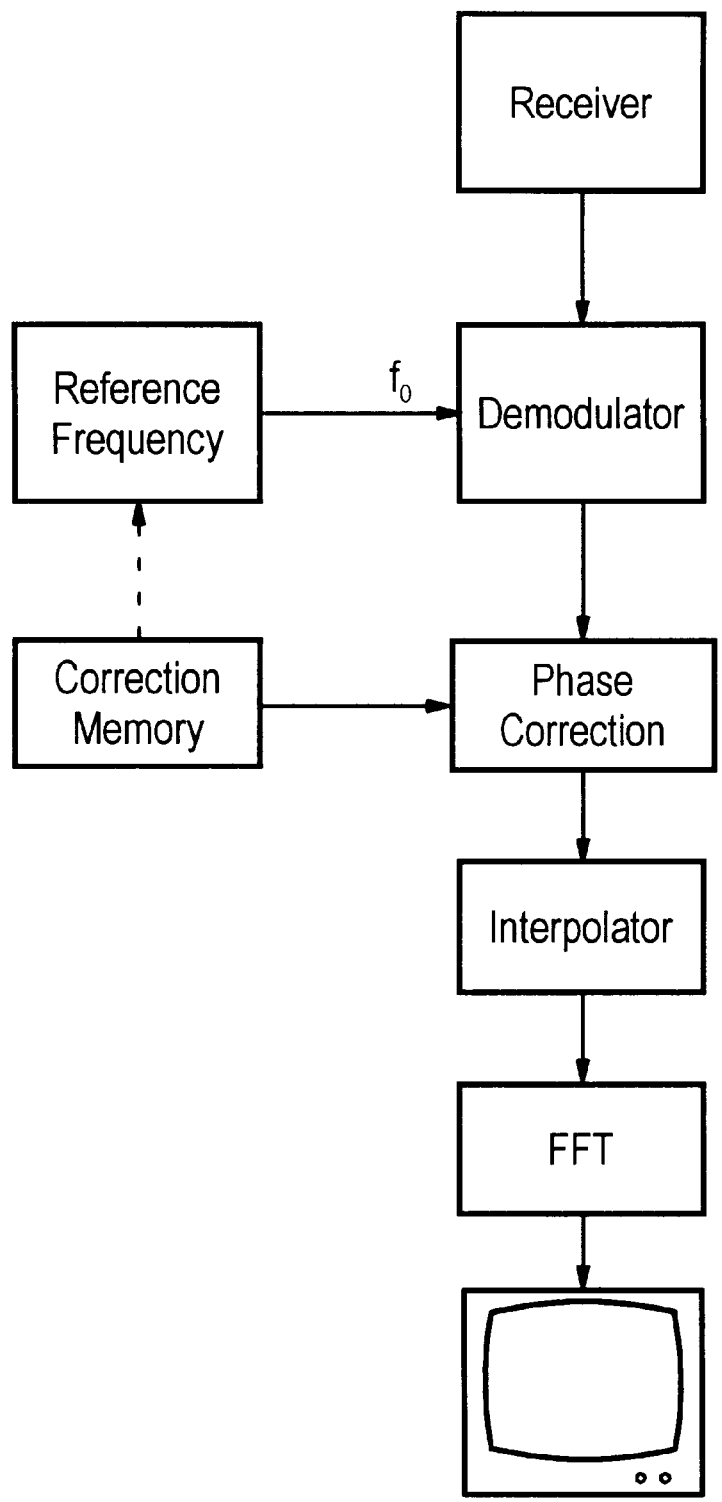
FIG. 14 is a schematic illustration of how the field inhomogeneity $\Delta B_0(t)$ is determined for the sinusoidal gradient Gx in the echo planar imaging sequence, in accordance with the invention.

The signals obtained so far are subject to phase errors due to the already-explained fluctuations of the basic magnetic field, which would lead to strong artefacts without further measures. If, however, based on the above-explained method, the phase response $\phi(t)$ or the field inhomogeneity $\Delta B_0(t)$ is determined for the sinusoidal gradient Gx which is employed, then the measured data can be corrected therewith. This is illustrated schematically in FIG. 14. The data obtained concerning phase errors or field inhomogeneity are stored in a correction memory. The nuclear magnetic resonance signals received in a receiver are demodulated in a demodulator. As stated in U.S. Pat. No. 5,289,127, the phase error of the reception signal can be corrected by correspondingly controlling the reference frequency or by correspondingly modulating the reception signal. It is also possible, however, using corresponding software, to carry out a phase correction after the demodulator on the basis of the data in the correction memory. Through an interpolator, the corrected values are again put into a predetermined equidistant raster. An image is subsequently produced by means of two-dimensional Fourier transformation.

The correction of basic field fluctuations caused by switched gradients has been described thus far for the EPI method, however, it should be emphasized that this method is suited for all gradient forms, i.e. all readout sequences. Of course, the problem of the basic field fluctuations becomes more serious the faster the gradients are switched, since eddy current effects then become stronger.

As an additional exemplary embodiment, the determination of the basic magnetic field curve in spiral scanning is explained. The spiral scanning method is presented in U.S. Pat. No. 4,651,096, and is distinguished in that in the two-dimensional case by two gradients of alternating polarity operating simultaneously, and in the three-dimensional case three such gradients operate. These gradients are of sinusoidal construction, and are dimensioned in their phase position relative to one another, as well as in their amplitude development, in such a way that a spiral-shaped scanning of the k-space results.

Figure 15:
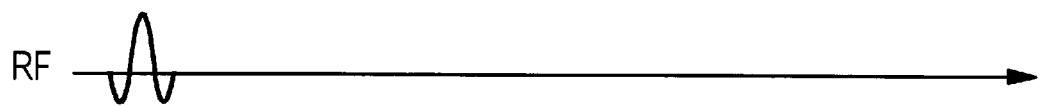
FIGS. 15–19 illustrate a spiral scan sequence with which the inventive method can be employed.
Figure 16:
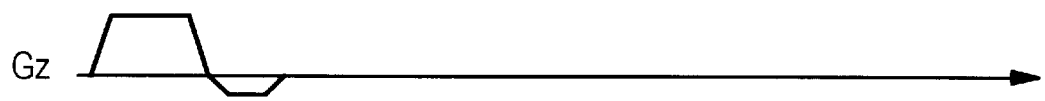
Figure 17:
Figure 18:
Figure 19:

For the measurement of the time curve of the basic magnetic field $B_0$, at first a slice-selective excitation is again carried out according to FIGS. 15 and 16. A phase-encoding gradient Gvx or Gvy is respectively again prefixed in the same direction to the sinusoidal readout gradients Gox or Goy, which are mutually offset by 90°, with both phase-encoding gradients being incremented step-by-step. In this case, a signal maximum of the nuclear magnetic resonance signal occurs when the rephasing condition is fulfilled in both the x and y directions, thus when the following holds:

$$\left| \int_0^T Gx(T)dT \right| + \left| \int_0^T Gy(T)dT \right| = 0$$

As in the previous example, the chronological curve of the phase-encoding gradient is obtained if the phase position of the nuclear magnetic resonance signal is measured along the signal maxima.

Phase errors due to fluctuations of the basic magnetic field $B_0$ can occur not only in the readout phase but also during excitation. This holds in particular if an oscillating gradient that causes eddy currents is in effect during the excitation. Examples of such pulse sequences include: SPAMM (Spatial Modulation of Magnetization, described in U.S. Pat. No. 5,054,489), excitation sequences that simultaneously operate in a spatially selective manner and in a spectrally selective manner (described e.g. in Magnetic Resonance in Medicine, vol. 15, pp. 287–304, 1990), and two- or three-dimensional excitation. The above problems can also occur, however, in conventional radio-frequency excitation pulses if eddy currents, which influence the $B_0$ field during excitation, are induced by means of steep flanks of the slice selection gradient. The method described can also be used for the correction of phase errors during excitation. For this purpose, the time curve of the basic field is determined for the same gradient curve that is in effect during excitation. On the basis of the information obtained in this way, the radio-frequency excitation pulses (e.g. similar to the description in U.S. Pat. No. 5,289,127) are phase-modulated in such a way that the influence of the varying basic magnet field is compensated.

The method described herein thus succeeds in measuring the time curve of the basic magnetic field under the effect of switched gradients, and in compensating the disturbing influence thereof during the excitation or, respectively, reading out of nuclear magnetic resonance signals. No special sample is thereby required, so that the measurement expense is reduced.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining a time curve of a basic magnetic field of a nuclear magnetic resonance apparatus in the presence of switched gradients, comprising the steps of:
   (a) exciting a nuclear magnetic resonance signal in a subject disposed in a basic magnetic field in a magnetic resonance tomography apparatus;
   (b) activating a phase-encoding gradient in a phase-encoding direction, said phase-encoding gradient having a gradient time integral;
   (c) activating a readout gradient in said phase-encoding direction with inverted or alternating polarity;
   (d) reading a nuclear magnetic resonance signal from said subject under said readout gradient;
   (e) identifying and storing a chronological position of at least one signal maximum of said nuclear magnetic resonance signal;
   (f) repeating steps (a) through (e) n times with a different gradient time integrals of said phase-encoding gradient in each repetition; and
   (g) obtaining a curve of phase positions of the respective stored signal maxima obtained over time during the repetitions in step (f), as a measure of any magnetic field deviation existing in said basic magnetic field at the time of each signal maximum.

2. A method as claimed in claim 1 wherein said readout gradient in step (c) has a chronological curve which is the same as a chronological curve for a readout gradient used for an image measurement.

3. A method as claimed in claim 1 wherein said readout gradient in step (c) has a chronological curve which is the same as for a gradient applied during emission of radio-frequency excitation pulses in an image measurement.

4. A method as claimed in claim 1 comprising the additional steps of:
   storing the curve of phase positions obtained in step (g); and
   phase-correcting, using said stored curve of phase positions, measured nuclear magnetic resonance signals obtained in subsequent image measurements using a readout gradient which is the same as the readout gradient in step (c).

5. A method as claimed in claim 4 wherein the step of phase-correcting measured nuclear magnetic resonance signals in subsequent image measurements comprises controlling a reference frequency of a demodulator during reception of said subsequently measured nuclear magnetic resonance signals.

6. A method as claimed in claim 1 comprising the additional steps of:
   storing the curve of phase positions obtained in step (g); and phase-correcting, using the stored curve of phase positions, radio-frequency excitation pulses in subsequent image measurements in which gradients used during emission of said radio-frequency excitation pulses are the same as the readout gradient in step (c).

7. A method for determining a time curve of a basic magnetic field of a nuclear magnetic resonance apparatus in the presence of switched gradients, comprising the steps of:
   (a) exciting a nuclear magnetic resonance signal in a subject disposed in a basic magnetic field in a magnetic resonance tomography apparatus;
   (b) activating a phase-encoding gradient in a first direction and activating a phase-encoding gradient in a second direction, perpendicular to said first direction, each phase-encoding gradient having a gradient time integral;
   (c) activating respective readout gradients with alternating signs in each of said first and second directions and, if necessary, activating a readout gradient with alternating signs in a third direction;
   (d) reading a nuclear magnetic resonance signal from said subject under said readout gradients;
   (e) identifying and storing a chronological position of at least one signal maximum of said nuclear magnetic resonance signal;
   (f) repeating steps (a) through (e) n times with respectively different gradient time integrals of the phase-encoding gradient in the first direction, and m times with different gradient time integrals of the phase-encoding gradient in the second direction; and
   (g) obtaining a curve of the phase positions of the respective stored signal maxima obtained over time in the repetitions of step (f), as a measure of the magnetic field deviation of said basic field existing at the time of each signal maximum.

8. A method as claimed in claim 7 wherein said readout gradients in step (c) has a chronological curve which is the same as a chronological curve for a readout gradients used for an image measurement.

9. A method as claimed in claim 7 wherein said readout gradients in step (c) has a chronological curve which is the same as for a gradients applied during emission of radio-frequency excitation pulses in an image measurement.

10. A method as claimed in claim 7 comprising the additional steps of:

storing the curve of phase positions obtained in step (g); and phase-correcting, using said stored curve of phase positions, measured nuclear magnetic resonance signals obtained in subsequent image measurements using a readout gradients which is the same as the readout gradients in step (c).

11. A method as claimed in claim 10 wherein the step of phase-correcting measured nuclear magnetic resonance signals in subsequent image measurements comprises controlling a reference frequency of a demodulator during reception of said subsequently measured nuclear magnetic resonance signals.

12. A method as claimed in claim 7 comprising the additional steps of:

storing the curve of phase positions obtained in step (g); and phase-correcting, using the stored curve of phase positions, radio-frequency excitation pulses in subsequent image measurements in which gradients used during emission of said radio-frequency excitation pulses are the same as the readout gradients in step (c).

* * * * *